KEYING DEVICE
Filed March 31, 1958
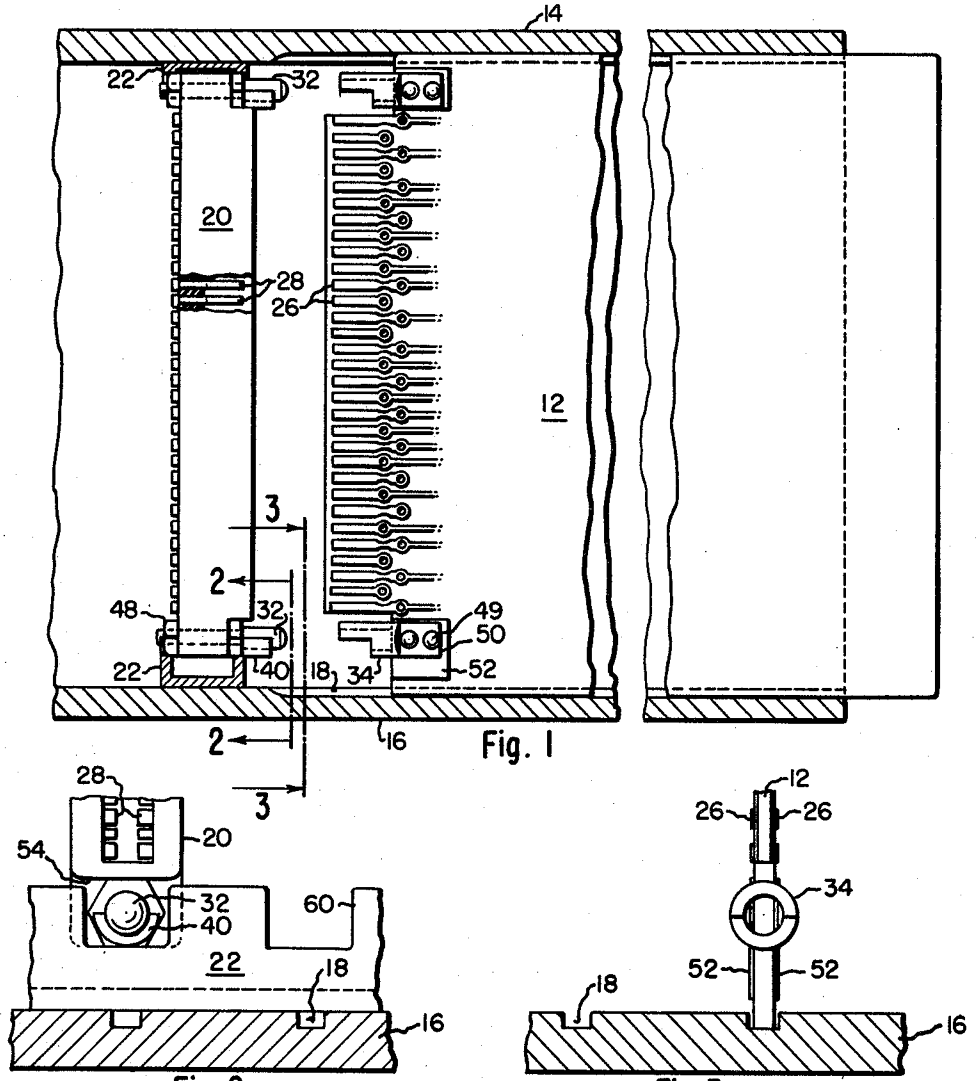
Fig. 1, Fig. 2, Fig. 3
Fig. 4
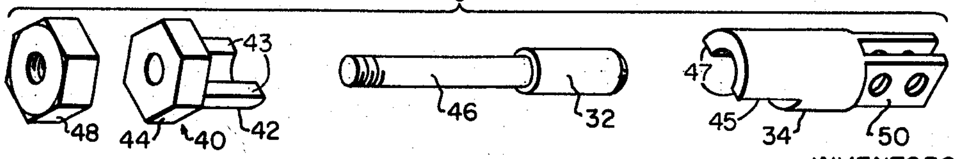
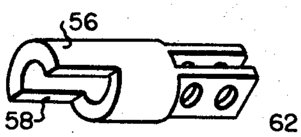
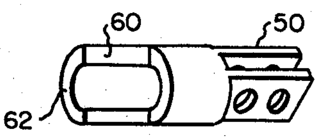
Fig. 5
Fig. 6
INVENTORS
THOMAS G. HAGAN
HOWARD A. SATTERLEE
FRINK MANSFIELD YOUNG
BY KENWAY, JENNEY, WITTER & HILDRETH
ATTORNEYS United States Patent Office 3,177,461
Patented Apr. 6, 1965

3,177,461

KEYING DEVICE

Thomas G. Hagan, Brookline, Howard A. Satterlee, Winchester, and Frink Mansfield Young, Boston, Mass., assignors to Adage, Inc., Cambridge, Mass., a corporation of Massachusetts Filed Mar. 31, 1958, Ser. No. 724,954
6 Claims. (Cl. 339—184)

The present invention relates to position coding means for plug-in circuit elements and more particularly to positioning devices for multiple contact plug-in elements to insure that a particular plug element can be inserted only in the correct receptacle of a group of similar receptacles otherwise capable of receiving the same plug.

In complex electrical equipment, typified by electronic computers, counting devices and the like, it is common practice to construct many of the circuit blocks or components on plug boards. These boards may utilize printed wiring techniques and, through use of transistors, may provide on individual boards a complete multistage amplifier, a flip-flop circuit or other component.

The boards are generally of thin strong insulating material and carry at one end a row of contact prongs or spring fingers to form the circuit connections with the rest of the equipment when the plug is inserted in a receptacle having matching contacts. In practice, the printed circuit boards may be arranged in a rack in closely spaced relation with the receptacles mounted within the rack to receive the plug contacts when the boards are entered in their positioning grooves in the rack and then pushed into place.

The advantages of such an arrangement are the ease of fabricating the circuit elements on the plug boards and the ability to assemble in compact relation a multiplicity of boards of various basic circuit types to make up extremely complex equipment. Furthermore, the servicing problem is simplified by the ability to remove individual boards and to replace with spares or suitably modified circuits.

A problem which has been encountered in this form of circuit construction arises from this otherwise desirable standardization of board sizes and receptacles. Unless great care is taken, a particular printed circuit board may be inserted by mistake in a receptacle having connections wired to receive an entirely different circuit. At the least, the result may be to disturb or prevent operation of the equipment, while in some cases there may be actual damage to components through improper connection of components to damaging supply voltages.

The present invention therefore has as an object the provision of simple but effective mechanical coding or polarizing means by which the entry of a plug board into a receptacle may be prevented except at the receptacle intended to receive that particular board.

More specifiaclly, the invention has as an object the provision of combined position coding and guide pin means by which the connector end of a printed circuit board may be accurately guided into aligned engagement with the receptacle and its multiple connecting fingers, provided that the coding means are in registry. If the coding means are not in registry, the plug end of the board will be positively prevented from entering the receptacle so that no electrical connection can take place.

Still another object is to provide position coding means of simple and inexpensive construction, employing a minimum number of elements which may be assembled and installed in various positions to achieve a substantial number of uniquely coded relations between receptacles and the plug ends of printed circuit boards.

In the accompanying drawings which indicate the features of the invention according to a preferred embodimen thereof, FIG. 1 is a view in side elevation, partly in section, illustrating the plug end of a board and the adjacent receptacle and showing the coding connectors in position to permit insertion of the board into the socket The board is illustrated in broken fashion to permit showing the desired parts in adequate scale FIG. 2 is a detail view on an enlarged scale, taken on the line 2—2 of FIG. 1 and showing a portion of a receptacle and a portion of the coding connector carried thereby.

FIG. 3 is a corresponding view looking towards the plug board and portion of the coding connector carried thereby and taken on the line 3—3 of FIG. 1.

FIG. 4 is an exploded view of the parts of a position-coding connector unit, the parts being separated along their axis for clarity.

FIG. 5 is a view of a coded socket element embodying a coding position different from that shown in FIGS. 3 and 4.

FIG. 6 is a socket having a third coding position.

Referring to FIG. 1, a typical plug board is indicated at 12. Such a board is generally of a phenolic or other composition of good insulating properties and may have circuit components such as resistors, capacitors and transistors mounted thereon with printed wiring to connect the elements. Representative circuit elements and printed wiring are omitted from the drawing as forming no part of the claimed invention.

The printed circuit board, along with other boards of similar size, is slidably received in a rack mounting comprising upper and lower shelves 14 and 16 having slots 18 to position the boards in spaced relation. The contacts on the boards when fully inserted in the rack are adapted to engage the contacts on the opposing faces of multi-contact receptacles 20 positioned within the rack. In the illustrative embodiment, the ends of the receptacles are received within channel members 22 with a slight amount of lost motion in order to permit freedom to align with the plug boards as the latter are inserted into the respective receptacles.

To make connection between the receptacles and the circuit of the plug board, which may carry a complete amplifier unit, saw-tooth generator, flip-flop circuit or other component, the rear edge of the plug board is provided with a row of contact fingers 26 on each side thereof. When the board is properly inserted, the fingers 26 engage the contacts 28 within the receptacle, the connections of the receptacle being interconnected with other receptacles and wired into the rest of the apparatus. Not all the plug and receptacle contacts may be used in every instance, but it is customary to employ a standard number of contacts for each board and receptacle in order to meet the requirements of the maximum number of connections required.

To align the plug end of the board accurately with the receptacle, telescoping pin and socket type connectors separate from the contacts of the board and receptacle are employed. Generally speaking the pins 32 are mounted in the reduced end portions of the receptacle body 20 while socket portions 34 are secured to the plug board in the region adjacent the plug end portion which carries the contact fingers 26. Engagement of the pin 32 and socket element 34 prior to entry of the end of the plug board into the receptacle insures that the receptacle and plug will align with greater precision than is provided by the guidance of the board within the rack slots 18.

The arrangement so far described, while permitting accurate insertion of the plug ends into the receptacles, lacks any means for preventing a board from being inserted in other than the correct receptacle. To accomplish this coding, there is provided a generally tubular socket formed by a pair of complementary separable socket or coding elements 34 and 40 having mating overlying surfaces extending parallel to the axis of the socket. A cylindrical pin element 32 is integrally mounted for movement with and extends coaxially of and within the socket element 40. Accordingly, when a pair of complementally arranged polarizing or socket elements of the type just described are moved coaxially toward each other, the pin element 32 will guide the socket elements into mating engagement with the pin element 32 being coaxially received within the tubular socket member formed by the mating socket elements. More specifically, there is provided a socket element 40 having at one end an arcuate cross sectioned sleeve section 42 extending coaxially at one end of the socket element and which partially surrounds the body of the pin to form an arcuate shoulder or abutment adjacent the end of the pin. The socket element 40 further comprises a pair of flat surfaces 43 each lying in a plane extending parallel to the axis of the socket element 40, such surfaces being formed by the longitudinal edge portions of the sleeve 42. The socket element 40 likewise includes an integral polygonal base portion 44 having a central bore through which passes the shank portion 46 of the pin. The body of the pin 32 is of somewhat larger diameter than the shank 46 in order to provide a shoulder by which the polygonal base portion 44 of the socket element 40 may be clamped when the parts are installed in the reduced end portions of the receptacle body 20 and secured by nut 48.

To cooperate with the coded socket element 40 mounting the pin, the socket elements 34 carried by the plug board are provided at one end with arcuate cross sectioned sleeve portions 45 extending coaxially of the socket element and which in the illustrative embodiment may be semicylindrical in configuration as may be the sleeves 42. The sleeves 45 are cross-sectionally complementary to the sleeves 42 and their longitudinal edge portions provide flat surfaces 47 extending parallel to the socket axis. The surfaces 47 are engageable with the surface 43 of the socket member 40 in mating overlying engagement when the socket elements are assembled by an endwise coaxial movement. The socket elements 34 are secured to the plug boards by means of rivets 49 or other suitable fastenings passing through a pair of mounting lugs or flanges 50 extending longitudinally of the socket element 34 from the end thereof opposite the sleeve 45 and extending laterally at right angles to the general plane of the surfaces 47 on the sleeve 45 whereby the surfaces 47 of the sleeves 45 bear a fixed predetermined angular relation in the plane of the plug board. Thin sheets of foil 52 serve to reinforce the boards at the point of attachment of the socket lugs.

By reason of the polygonal base 44 of the coded socket element surrounding the pin, the socket element may be installed in any one of a number of accurately determined positions around its axis. The fact that the receptacle body is provided with shoulders 54 insures that the coded socket element will be positively retained in desired position while the clamp nut 48 is being tightened.

If the base portion of the coded socket element 40 is hexagonal, then there are six unique positions in which the semicylindrical sleeve portion 42 may be installed, but only one of these will register in mating relationship with a particular coded socket element on the plug board. If exact registration does not obtain, then the arcuate end of the sleeve 42 will encounter the arcuate end or a portion thereof of the sleeve of the socket element 34, thereby positively preventing insertion of the plug contacts into the receptacle. Because of the guidance afforded by the upper and lower shelves 14 and 16 of the rack, failure of either one of the two sets of coding units to register will be effective to prevent insertion of the terminal portion of the printed circuit board into the receptacle.

The number of coding positions is doubled by taking into consideration that two independent sets of coded connectors are employed for each board and receptacle. By mounting the coded socket elements 34 at unequal distances inwardly from the top and bottom margins of the printed circuit board, as shown in FIG. 1, and with the socket elements 40 similarly spaced in the receptacle, the respectively associated pair of socket elements will align axially in only one position of the board so that insertion in inverted position is prevented even though the coding elements might be in registering position if axially aligned.

The number of coding positions may be substantially increased by making available additional socket elements similar to the element 40 but in which the projecting sleeve portions are in different angular positions relative to the lugs 50. As illustrated in FIGS. 5 and 6, such socket elements may have their arcuate projections or extensions obliquely inclined relative to the lugs so as to register with the pin bearing socket elements 40 when the polygonal bases of these elements are installed in other than the position illustrated in FIGS. 1–4. In FIG. 5 the semicylindrical extension 56 may have the plane of its cutaway face 58 disposed at an angle of 30° to the right of the general plane of the lugs, while in FIG. 6 the plane of the face 60 of the extension 62 lies 30° counterclockwise to the general plane of the mounting lugs 50. As a result, by using selected combinations from the hexagonally based socket element 40 and the three coded socket elements 34, six unique positions are available for one set of coding connectors while a total of thirty-six different positions are provided because of the fact that coding is possible both at the top and bottom ends of the receptacle.

To provide the slight degree of lost motion heretofore recommended for the mounting of the receptacles within their supporting channels 22, the channels may have cutouts 60 to provide clearance for the coded socket elements 40 and retaining nuts 48 while still supporting the receptacles effectively against front to back displacement to withstand the very substantial forces involved in connecting and separating the plug board and receptacle.

In the operation of inserting a printed circuit board, the operator will of course take normal precautions to insure that the board is entered in the proper set of slots in the rack to register with the correct receptacle. Numbering or lettering of the slots and boards or other identification means may be provided and will usually lead to correct placement. As the plug board is slid into place the ends of the coding socket elements 34 coaxially engage the rounded ends of the pins to start the final guiding action of the connectors.

Assuming that the board has been entered in the proper slots, the projecting sleeve portions of the socket elements will register with the complementary cut-away portions to permit the projecting portions to slide over one another into mating engagement. At the limit of movement permitted, the contact fingers of the board will have been brought into engagement with the receptacle contacts to complete all connections to the printed circuit.

If, on the other hand, the board has been mistakenly inserted in an incorrect location, or the wrong board has been selected, one or both of the socket elements will be operative to prevent insertion of the plug board in the receptacle. The projecting ends of the pins will be effective to prevent misalignment of the socket elements while the direct abutment of the end portions of the socket elements will afford positive indication that a mistake has been made.

It will be observed that the coding system of the invention in no way interferes with the use of the customary plug board extender whenever a printed circuit board is to be operated while in accessible position outside the rack. By equipping the plug board extender at the plug end with connectors having plain short sockets without projecting coding portions, the sockets will fit over the guide pins without any interference from the arcuate coding sleeve portions of the socket elements 40 on the receptacles. At the receptacle end, the board will be provided simply with pins. As a result, an extender may be used between any receptacle and the printed circuit board with no interference from the position coding means.

While the invention has been described in terms of a particular configuration of projecting and cut-away portions of cooperating connector elements, and with a specific number of different angular positions provided by the particular polygon selected for the sleeve base, it will be understood that such selection has been merely to show a typical embodiment that affords a substantial number of coding positions, suitable for many installations. Other configurations of mating connector portions and number of angularly coded positions may be utilized with equal effectiveness to prevent mating of the coding elements except in a single rotationally aligned relation of complementary projecting and cut-away portions, within the scope of the appended claims.

We claim as our invention:

1. In a multi-contact plug board and receptacle assembly, coding connector means separate from the contacts of the board anl receptacle to prevent insertion of the plug board in other than the correct receptacle for that board, said coding connector means comprising a tubular socket formed by a pair of separable socket elements carried respectively by the board and receptacle, said pair of socket elements including a pair of coded sleeve portions each extending coaxially of the socket and only partially about the axis thereof in complementary relation to each other, said sleeve portions being engaged in mating relation, one of the socket elements integrally mounting a cylindrical pin element for movement therewith with the pin element extending concentrically of and within one of the socket elements, one of the socket elements having a polygonal base portion arranged coaxially thereof, the receptacle having means engaging said polygonal portion to locate the same in a selected one of a plurality of coding positions disposed angularly about the socket axis and corresponding in number to the number of sides on said polygonal portion, and means mounting the other socket element on the plug board in a selected one of a plurality of coding positions spaced angularly about the socket axis.

2. In a combination, a multi-contact plug board and matching receptacle movable into engagement during relative movement therebetween in one direction, said plug board and receptacle each having a pair of marginal edge portions spaced apart on opposite sides of the contacts thereof, and means separate from the contacts for preventing insertion of the plug board into other than said receptacle including a pair of coaxially arranged polarizing elements mounted on each of the plug and receptacle and disposed on opposite sides of the contacts thereof adjacent the marginal edge portions thereof, the polarizing elements on one of said plug and receptacle being unequally spaced from the marginal edge portions thereof, the polarizing elements adjacent corresponding marginal edge portions of the plug and receptacle having cross sections extending only partially about the axis thereof in spaced relation thereto thus providing mating surfaces which extend generally in said one direction and which are complementally engageable in only one relative angular position of the polarizing elements about their axis, and means for mounting at least one of the polarizing elements in a plurality of coding positions spaced angularly about its axis.

3. In a multi-contact plug board and matching receptacle assembly movable into engagement during relative movement therebetween in one direction; improved coding means separate from the contacts of the plug board and receptacle for preventing insertion of the plug board into other than said receptacle, said coding means comprising a pair of coaxially arranged sleeve portions having cross sections extending only partially about the axis of the sleeve portions in spaced relation thereto thus providing on each sleeve portion spaced apart surfaces which extend generally in said one direction and which mate with corresponding surfaces on the other sleeve portion, said surfaces on the sleeve portions being engageable in mating relation in only one relative angular position of the sleeve portions about said axis, and means for mounting the sleeve portions on the plug board and receptacle in a plurality of discrete positions spaced apart angularly about said axis.

4. Coding means for use with a multi-contact plug board and receptacle, said coding means being separate from the contacts of the plug board and receptacle and comprising a pair of coaxially and complementally engageable coding sleeve portions, each sleeve portion having a cross section which in its entirety extends only partially about the axis of the sleeve portion in spaced relation to said axis and in complementary relation to the cross section of the other sleeve portion of said pair, said sleeve portions when complementally engaged forming a sleeve extending coaxially of said axis, and means for mounting the sleeve portions on a plug board and receptacle in a plurality of different angular positions about said axis with the sleeve portions in complementary relation, said means including members connected to said sleeve portions and having flat surfaces engageable with flat surfaces on a plug board and receptacle.

5. In a pair of separable electrical connectors of the type having a plurality of spaced interengaging contact members on the opposing faces thereof, the improvement which comprises a set of opposing flanges extending from said connectors at one end thereof, said flanges being spaced apart and having shaped openings therein, a pair of polarizing members, said members having mating portions which complement each other, and means for mounting said members in a plurality of different angular positions on the respective flanges with the mating portions thereof in complementary relation, said means including members connected to the polarizing members and fitting the shaped openings in the flanges.

6. In a pair of separable electrical connectors, the improvement which comprises a set of opposing flanges extending from the connectors at opposite ends thereof, the flanges of each set being spaced apart and having shaped openings therein, a pair of polarizing members extending inwardly from opposing surfaces of the flanges of each set, each pair of polarizing members having mating portions which oppose and complement each other, and means for positioning the polarizing members of each pair in a plurality of different angular positions on the flanges, said means including members connected to the polarizing members and fitting the shaped openings in the flanges.

(References on following page)

References Cited by the Examiner

UNITED STATES PATENTS

| | | | |
|---|---|---|---|
| 627,946 | 6/99 | Wilcox | 287—104 |
| 651,662 | 6/00 | Hawes | 287—104 |
| 867,312 | 10/07 | Shutz | 339—47 |
| 1,991,822 | 2/35 | Snipes. | |
| 2,230,028 | 1/41 | Del Camp. | |
| 2,490,316 | 12/49 | Ostrak | 339—47 |
| 2,572,448 | 10/51 | Child | 339—49 |
| 2,746,022 | 5/56 | Gilbert. | |
| 2,902,665 | 9/59 | D'Amico. | |

FOREIGN PATENTS

| | | |
|---|---|---|
| 630,333 | 10/49 | Great Britain. |

JOSEPH D. SEERS, *Primary Examiner.*

ALBERT H. KAMPE, *Examiner.*